United States Patent
Zhu et al.

(10) Patent No.: US 12,034,012 B2
(45) Date of Patent: Jul. 9, 2024

(54) ARRAY SUBSTRATE, DISPLAY PANEL AND DISPLAY APPARATUS

(71) Applicant: KunShan Go-Visionox Opto-Electronics Co., Ltd., Jiangsu (CN)

(72) Inventors: Xuejing Zhu, Kunshan (CN); Yuan Yao, Kunshan (CN); Xiyang Jia, Kunshan (CN); Xiujian Zhu, Kunshan (CN); Zhengyong Zhu, Kunshan (CN); Jiuzhan Zhang, Kunshan (CN)

(73) Assignee: KunShan Go-Visionox Opto-Electronics Co., Ltd., Kunshan (CN)

( * ) Notice: Subject to any disclaimer, the term of this patent is extended or adjusted under 35 U.S.C. 154(b) by 423 days.

(21) Appl. No.: 17/592,114

(22) Filed: Feb. 3, 2022

(65) Prior Publication Data

US 2022/0157860 A1 May 19, 2022

Related U.S. Application Data

(63) Continuation of application No. PCT/CN2020/132461, filed on Nov. 27, 2020.

(30) Foreign Application Priority Data

Jan. 8, 2020 (CN) .......................... 202010017580.0

(51) Int. Cl.
  *H01L 27/12* (2006.01)
(52) U.S. Cl.
  CPC ................................. *H01L 27/1244* (2013.01)
(58) Field of Classification Search
  None
  See application file for complete search history.

(56) References Cited

U.S. PATENT DOCUMENTS

2022/0077193 A1* 3/2022 Shin ...................... G06F 3/0446
2022/0320230 A1* 10/2022 Zhang .................... H10K 59/65

FOREIGN PATENT DOCUMENTS

| CN | 104064581 A | 9/2014 |
| CN | 108154842 A | 6/2018 |

(Continued)

OTHER PUBLICATIONS

International Search Report (with English Translation) and Written Opinion issued on Feb. 26, 2021 in corresponding International Application No. PCT/CN2020/132461, 13 pages.

(Continued)

*Primary Examiner* — Bilkis Jahan
(74) *Attorney, Agent, or Firm* — Maier & Maier, PLLC (57) ABSTRACT

The present application discloses an array substrate, a display panel, and a display apparatus. The array substrate includes a hole-punching area, a wiring area at least partially surrounding the hole-punching area and a wire-wrapping area between the hole-punching area and the wiring area, the array substrate includes: a substrate and a first wiring layer arranged on the substrate; a shielding assembly at least including a first shielding layer arranged on a side of the first wiring layer, the side of the first wiring layer being away from the substrate, and the first shielding layer being insulated from the first signal wires in the first wiring layer, the first shielding layer being electrically connected to a first fixed potential terminal, wherein an orthographic projection of the first shielding layer on the substrate covers an orthographic projection of the first wire-wrapping segment of the first signal wire on the substrate.

20 Claims, 10 Drawing Sheets

(56) References Cited

FOREIGN PATENT DOCUMENTS

| CN | 108206203 | A |   | 6/2018  |           |
|----|-----------|---|---|---------|-----------|
| CN | 108459445 | A |   | 8/2018  |           |
| CN | 109119447 | A | * | 1/2019  | H01L 27/32 |
| CN | 109389907 | A |   | 2/2019  |           |
| CN | 110208994 | A |   | 9/2019  |           |
| CN | 110244873 | A |   | 9/2019  |           |
| CN | 110299384 | A |   | 10/2019 |           |
| CN | 110299386 | A | * | 10/2019 | H01L 27/32 |
| CN | 110610667 | A |   | 12/2019 |           |
| CN | 111081141 | A |   | 4/2020  |           |
| JP | 2003115912 | A |  | 4/2003  |           |

OTHER PUBLICATIONS

The First Office Action issued on Feb. 2, 2021, in connection with corresponding Chinese Application No. 202010017580.0 (18 pages, including machine-generated English translation).
The Second Office Action issued on Jun. 23, 2021, in connection with corresponding Chinese Application No. 202010017580.0 (19 pages, including machine-generated English translation).
The Rejection Decision issued on Nov. 3, 2021, in connection with corresponding Chinese Application No. 202010017580.0 (7 pages, including partial English translation).

* cited by examiner

ARRAY SUBSTRATE, DISPLAY PANEL AND DISPLAY APPARATUS

CROSS REFERENCE TO RELATED APPLICATION

The present application is a continuation of International Application No. PCT/CN2020/132461 filed on Nov. 27, 2020, which claims the benefit of priority to Chinese Patent Application No. 202010017580.0 filed on Jan. 8, 2020, both of which are incorporated herein by reference in their entireties.

TECHNICAL FIELD

The present application relates to the field of display technology, and particularly to an array substrate, a display panel, and a display apparatus.

BACKGROUND

With the rapid development of electronic devices, demands of users for the screen-to-body ratio are higher and higher. Generally, a part of the display area of the display panel is holed to integrate photosensitive assemblies such as cameras, signal wires on a peripheral side of the integrated camera or other photosensitive assemblies need to be detoured, and a plurality of detoured signal wires are dense and overlap to cause capacitive coupling which results in crosstalk, and the display effect is affected.

SUMMARY

The embodiments of the present application provide an array substrate, a display panel, and a display apparatus, which aim to reduce crosstalk between signal wires due to capacitive coupling and improve the display effect.

In a first aspect, the present application provides an array substrate comprising a hole-punching area, a wiring area at least partially surrounding the hole-punching area and a wire-wrapping area between the hole-punching area and the wiring area, the array substrate comprising: a substrate; a first wiring layer arranged on a side of the substrate, and the first wiring layer comprising a plurality of first signal wires, at least one of the plurality of first signal wires comprising a first straight segment in the wiring area and a first wire-wrapping segment in the wire-wrapping area, the first wire-wrapping segment being arranged around a part of the hole-punching area; and a shielding assembly at least comprising a first shielding layer arranged on a side of the first wiring layer, the side of the first wiring layer being away from the substrate, and the first shielding layer being insulated from the first signal wires, the first shielding layer being electrically connected to a first fixed potential terminal, and an orthographic projection of the first shielding layer on the substrate covering an orthographic projection of the first wire-wrapping segment on the substrate.

In a second aspect, the present application provides a display panel comprising a display area and a non-display area, the display panel comprising the array substrate of the above first aspect, wherein the wiring area and the wire-wrapping area are corresponding to the display area, and the hole-punching area is corresponding to the non-display area.

In a third aspect, the present application provides a display apparatus comprising the display panel of the above second aspect.

In the embodiments of the present application, the first shielding layer is arranged on a side of the first wiring layer, the side of the first wiring layer is away from the substrate, and the first shielding layer is electrically connected to the first fixed potential terminal, a coupling capacitance between two adjacent first wire-wrapping segments can be reduced, so as to reduce the crosstalk caused by the coupling capacitance in a pixel circuit and improve the display effect.

DETAILED DESCRIPTION

Features and exemplary embodiments of various aspects of the present application will be described in detail below. In order to make the objects, technical solutions, and advantages of the present application clearer, the present application will be further described in detail below with reference to the accompanying drawings and specific embodiments. It is understood that the specific embodiments described herein are merely configured to explain the present application, rather than to limit the present application. For those skilled in the art, the present application can be implemented without some of these specific details. The following description of the embodiments is merely to provide a better understanding of the present application by illustrating the examples of the present application.

It should be noted that the embodiments of the present application and the features in the embodiments can be combined with each other if there is no conflict.

Figure 1:
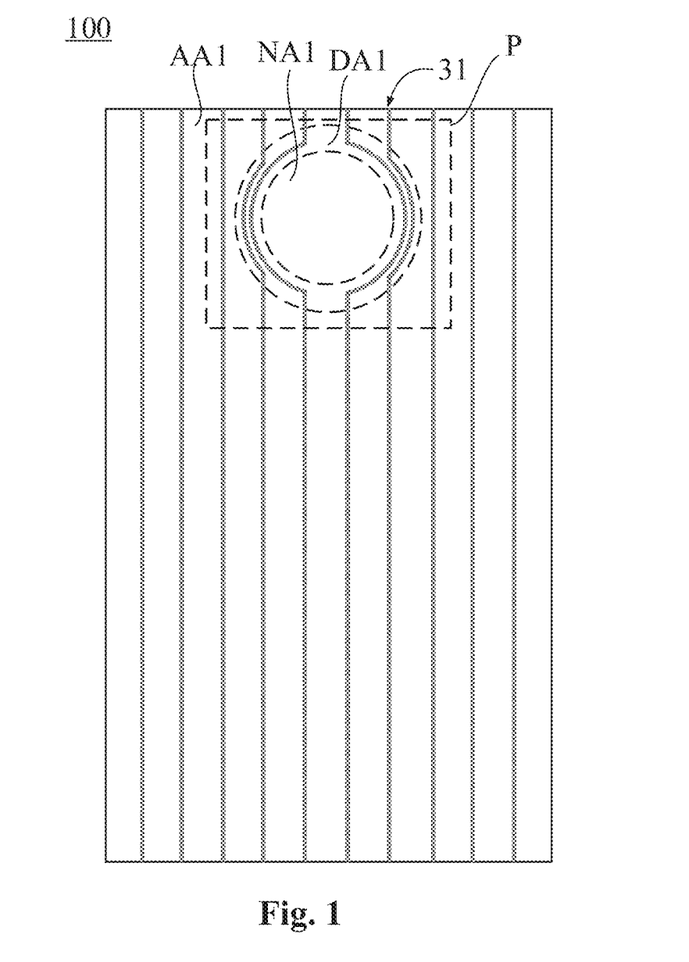
FIG. 1 shows a top perspective view of an array substrate of an embodiment of the present application.
Figure 2:
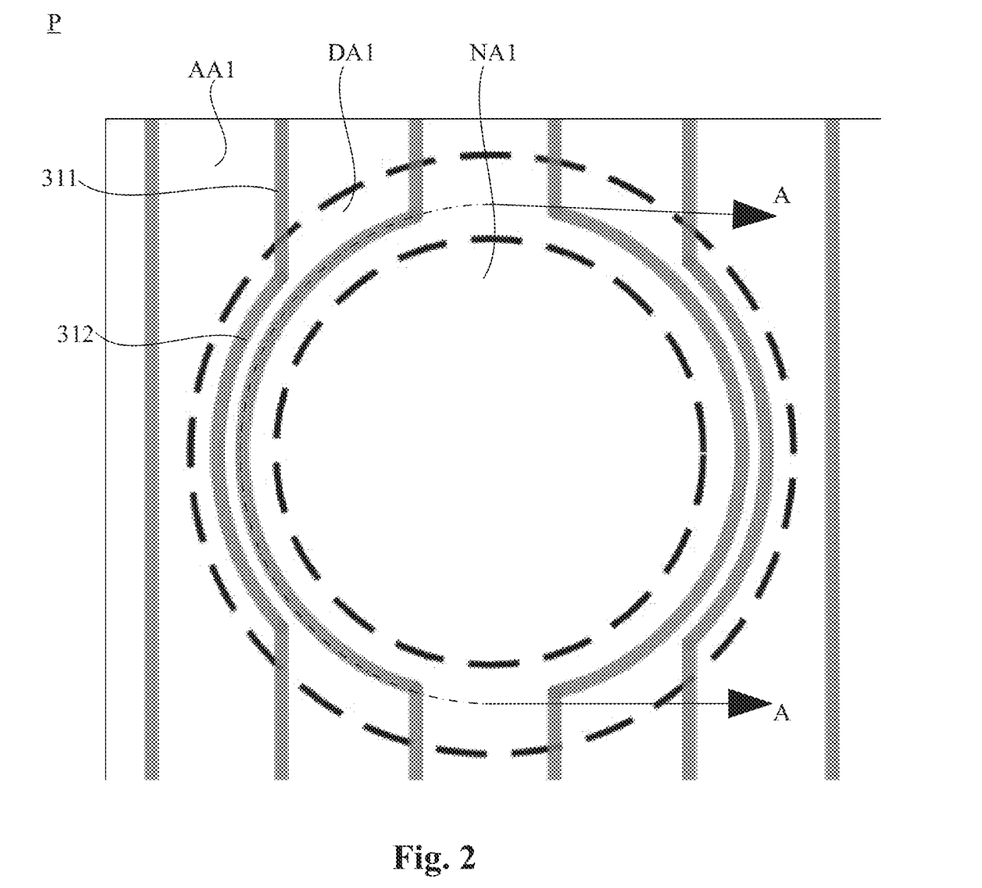
FIG. 2 shows an enlarged schematic diagram of part P in FIG. 1.
Figure 3:
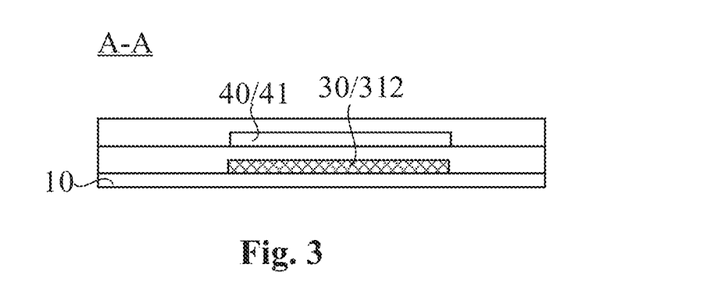
FIG. 3 shows a cross-sectional view of A-A in FIG. 2.

The array substrate, the display panel, and the display apparatus of the embodiments of the present application will be described in detail blow with reference to FIGS. 1 to 18. In order to clearly illustrate the structures related to the present application, some well-known structures are not shown or transparently drawn in the drawings. Please refer to FIGS. 1 to 3, in which FIG. 1 shows a top perspective view of an array substrate of an embodiment of the present application, FIG. 2 shows an enlarged schematic diagram of part P in FIG. 1, and FIG. 3 shows a cross-sectional view of A-A in FIG. 2. The array substrate 100 includes a hole-punching area NA1, a wiring area AA1 at least partially surrounding the hole-punching area NA1, and a wire-wrapping area DA1 between the hole-punching area NA1 and the wiring area AA1. The hole-punching area NA1 of the array substrate 100 is configured to accommodate functional devices, such as an image collector, an infrared sensor, a proximity sensor, an infrared lens, a flood light sensing element, an ambient light sensor, a dot projector and other photosensitive devices, as well as a handset, a speaker and other devices.

The array substrate 100 of the embodiment includes a substrate 10, a first wiring layer 30, and a shielding assembly 40 which are stacked in sequence.

The first wiring layer 30 is arranged on a side of the substrate 10 and includes a plurality of first signal wires 31. At least one of the plurality of first signal wires 31 includes a first straight segment 311 in the wiring area AA1 and a first wire-wrapping segment 312 in the wire-wrapping area DA1, and the first wire-wrapping segment 312 is arranged around a part of the hole-punching area NA1.

The shielding assembly 40 at least includes a first shielding layer 41 arranged on a side of the first wiring layer 30, the side of the first wiring layer 30 is away from the substrate 10, and the first shielding layer 41 is insulated from the first signal wires 31, the first shielding layer 41 is electrically connected to a first fixed potential terminal, and an orthographic projection of the first shielding layer 41 on the substrate 10 covers an orthographic projection of the first wire-wrapping segment 312 on the substrate 10. The fixed potential terminal in the present application refers to a potential terminal of which the electrical signal does not change.

According to the array substrate 100 of the embodiment, the first shielding layer 41 is arranged on a side of the first wiring layer 30, the side of the first wiring layer 30 is away from the substrate 10, and the first shielding layer 41 is electrically connected to the first fixed potential terminal, the coupling capacitance between two adjacent first wire-wrapping segments 312 can be reduced, so as to reduce the crosstalk caused by the coupling capacitance in the pixel circuit and improve the display effect.

Figure 4:
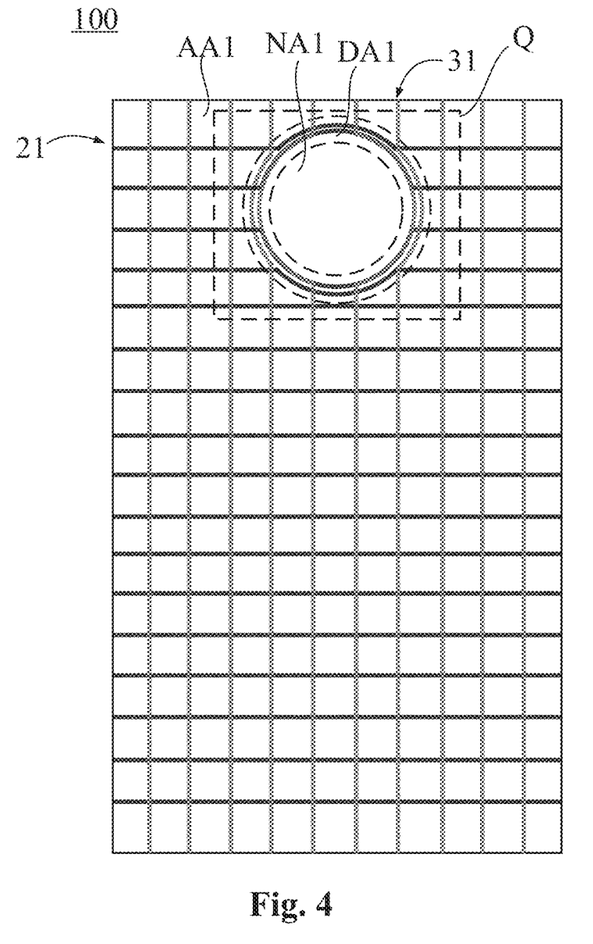
FIG. 4 shows a top perspective view of an array substrate of another embodiment of the present application.
Figure 5:
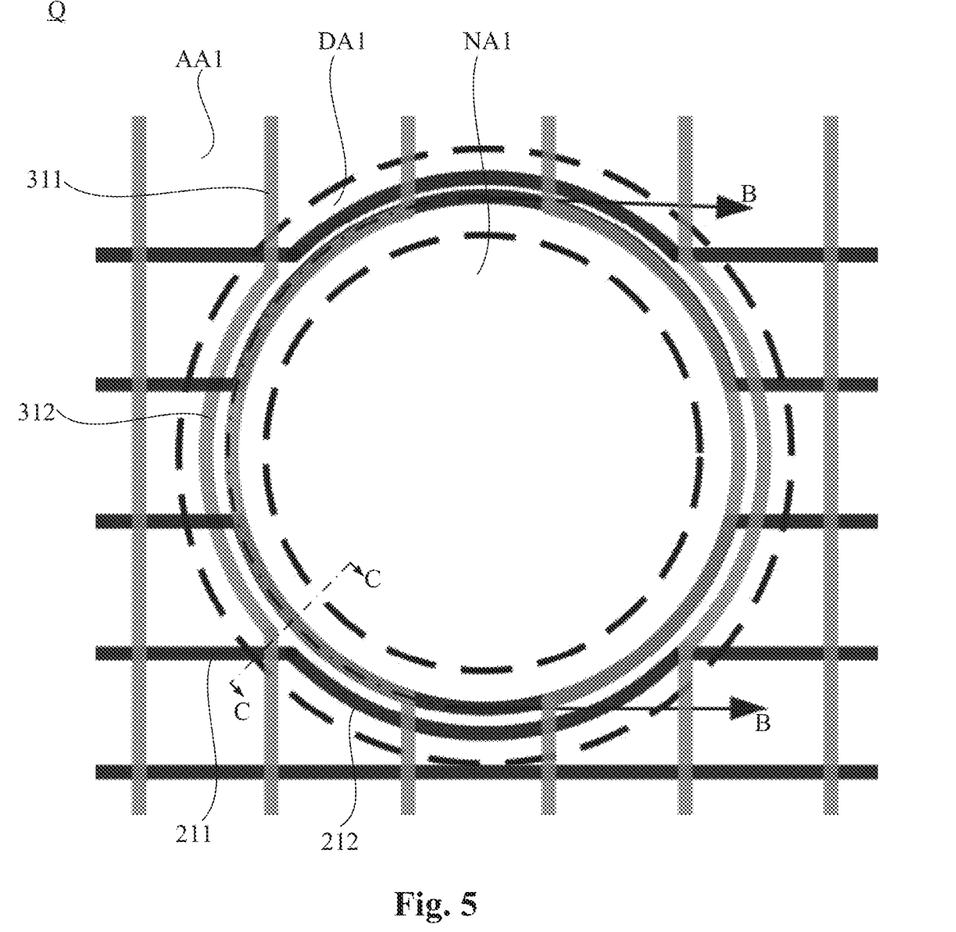
FIG. 5 shows an enlarged schematic diagram of part Q in FIG. 4.
Figure 6:
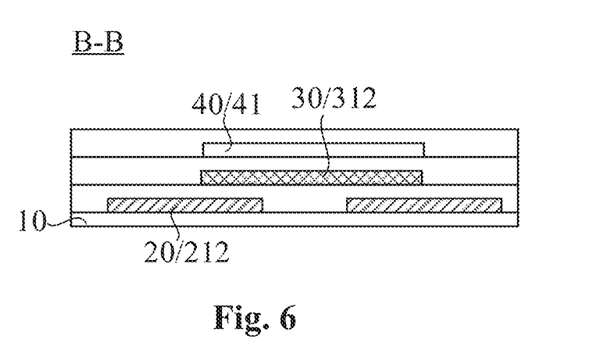
FIG. 6 shows a cross-sectional view of B-B in FIG. 5.

Please refer to FIGS. 4 to 6, in which FIG. 4 shows a top perspective view of an array substrate of another embodiment of the present application, FIG. 5 shows an enlarged schematic diagram of part Q in FIG. 4, and FIG. 6 shows a cross-sectional view of B-B in FIG. 5. In some other optional embodiments, the array substrate 100 further includes a second wiring layer 20 arranged between the substrate 10 and the first wiring layer 30, and the second wiring layer 20 includes a plurality of second signal wires 21, at least one of the plurality of second signal wires 21 includes a second straight segment 211 in the wiring area AA1 and a second wire-wrapping segment 212 in the wire-wrapping area DA1, the second wire-wrapping segment 212 is arranged around a part of the hole-punching area NA1, in which the second wire-wrapping segment 212 at least partially overlaps the first wire-wrapping segment 312. The first shielding layer 41 can further reduce the coupling capacitance caused by the overlapping of the first signal wires 31 and the second signal wires 21 in the wire-wrapping area DA1.

In some embodiments, the second signal wires 21 may be a plurality of scan wires (scan wires) and/or a plurality of light emission control signal wires (emit wires), and the first signal wires 31 may be a plurality of data wires (data wires). The scan wires, the emit wires, and the data wires overlap in the wire-wrapping area DA1 to cause a coupling capacitance, and there is also a coupling capacitance between two adjacent data wires. When the voltage of one signal wire changes, the signal voltage of the data wires which are adjacent to the signal wire will also change, thus the display effect is affected. The first shielding layer 41 is arranged on a side of the first signals 31, the side of the first signals 31 is away from the substrate 10, and the first shielding layer 41 is insulated from the first signal wires 31, the orthographic projection of the first shielding layer 41 on the substrate 10 covers the orthographic projection of the first wire-wrapping segment 312 on the substrate 10, that is, the first shielding layer 41 is located directly above the first signal wires 31 in the wire-wrapping area DA1 and covers the first wire-wrapping segment 312 in the wire-wrapping area DA1, and the first shielding layer 41 is electrically connected to the fixed potential terminal, the coupling capacitance between the data wires and the coupling capacitance in the overlapping area of the data wires, the scan wires, and the emit wires can be effectively reduced.

In some optional embodiments, a distance L between two adjacent first wire-wrapping segments 312 satisfies L≥3 μm. The coupling capacitance between the two adjacent first wire-wrapping segments 312 can be reduced by appropriately increasing the distance between the two adjacent first wire-wrapping segments 312.

In the following embodiments, for example, the second signal wires 21 are a plurality of scan wires and/or emit wires, and the first signal wires 31 are a plurality of data wires.

Figure 7:
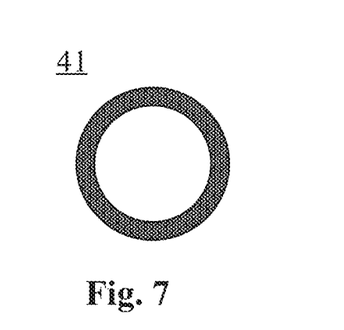
FIG. 7 shows a schematic structural diagram of a first shielding layer of an embodiment of the present application.
Figure 8:
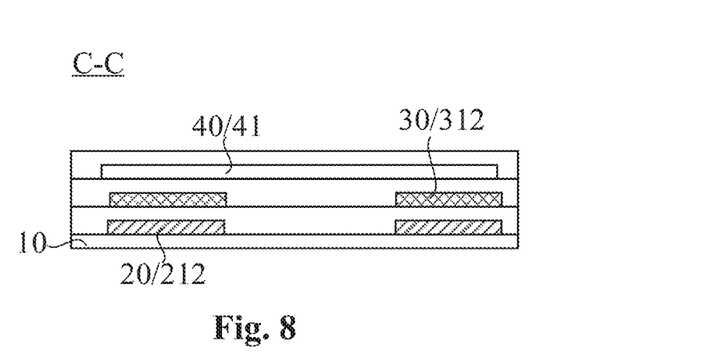
FIG. 8 shows a cross-sectional view of C-C in FIG. 5.

In some optional embodiments, please refer to FIG. 7 that shows a schematic structural diagram of a first shielding layer provided by an embodiment of the present application, and FIG. 8 that shows a cross-sectional view of C-C in FIG. 5. The first shielding layer 41 is arranged in the wire-wrapping area DA1 and is a ring-shaped layer structure arranged around the hole-punching area NA1. In the embodiment, the first shielding layer 41 is a ring-shaped layer structure which can effectively cover each first wire-wrapping segment 312 and simplify the manufacturing process.

Figure 9:
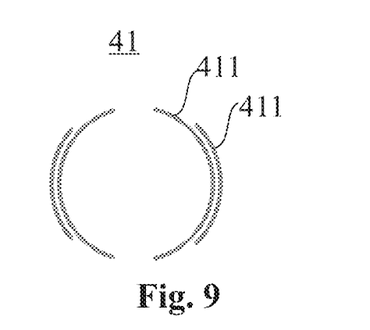
FIG. 9 shows a schematic structural diagram of a first shielding layer of another embodiment of the present application.
Figure 10:
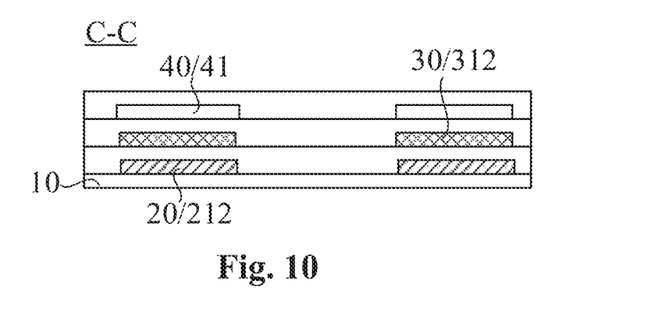
FIG. 10 shows another cross-sectional view of C-C in FIG. 5.

In some other optional embodiments, please refer to FIG. 9 that shows a schematic structural diagram of a first shielding layer provided by another embodiment of the present application, and FIG. 10 that shows another cross-sectional view of C-C in FIG. 5. The first shielding layer 41 is arranged in the wire-wrapping area DA1 and includes a plurality of first shielding wires 411, and an orthographic projection of each first shielding wire 411 on the substrate 10 covers the orthographic projection of the first wire-wrapping segment 312 on the substrate 10. Further, the orthographic projection of the first shielding wire 411 on the substrate 10 coincides with the orthographic projection of the first wire-wrapping segment 312 on the substrate 10. In the embodiment, the patterned first shielding layer 41 is utilized, and the first shielding wires 411 are only arranged above the first wire-wrapping segment 312, cost can be saved. In the embodiment, each of the first shielding wires 411 may be directly connected to the first fixed potential terminal, alternatively, the first shielding wires 411 may be short-circuited through a first short-circuiting wire and then connected to the first fixed potential terminal through the first short-circuiting wire.

Figure 11:
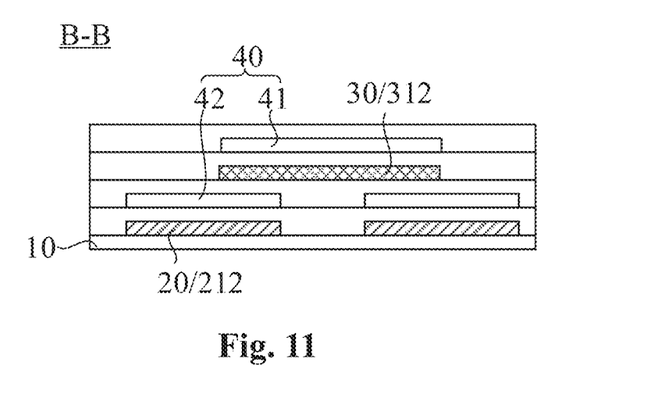
FIG. 11 shows another cross-sectional view of B-B in FIG. 5.

In some optional embodiments, please refer to FIG. 11, which shows another cross-sectional view of B-B in FIG. 5. The shielding assembly 40 further includes a second shielding layer 42 arranged between the second wiring layer 20 and the first wiring layer 30, and the second shielding layer 42 is insulated from the second signal wires 21 and the first signal wires 31. The second shielding layer 42 is connected to a second fixed potential terminal. An orthographic projection of the second shielding layer 42 on the substrate 10 covers an orthographic projection of the second wire-wrapping segment 212 on the substrate 10. In the embodiment, the second shielding layer 42 is arranged between the second signal wires 21 and the first signal wires 31, and the second shielding layer 42 is connected to the second fixed potential terminal, the coupling capacitance caused by the overlapping of the second signal wires 21 and the first signal wires 31 in the wire-wrapping area DA1 can be reduced, so as to reduce the crosstalk caused by the coupling capacitance in the pixel circuit and improve the display effect.

Further, in some embodiments, the second shielding layer 42 is arranged in the wiring area AA1 and the wire-wrapping area DA1, and the orthographic projection of the second shielding layer 42 on the substrate 10 further covers an orthographic projection of the second straight segment 211 on the substrate 10. In the embodiment, the second shielding layer 42 covers the second signal wires 21 in the wiring area AA1 and the wire-wrapping area DA1, which can further improve the shielding effect and reduce the coupling capacitance between the second signal wires 21 and the first signal wires 31.

Figure 12:
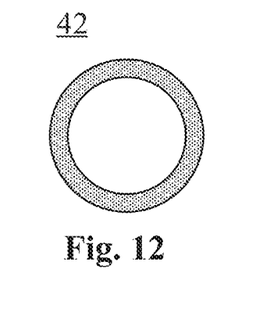
FIG. 12 shows a schematic structural diagram of a second shielding layer of an embodiment of the present application.
Figure 13:
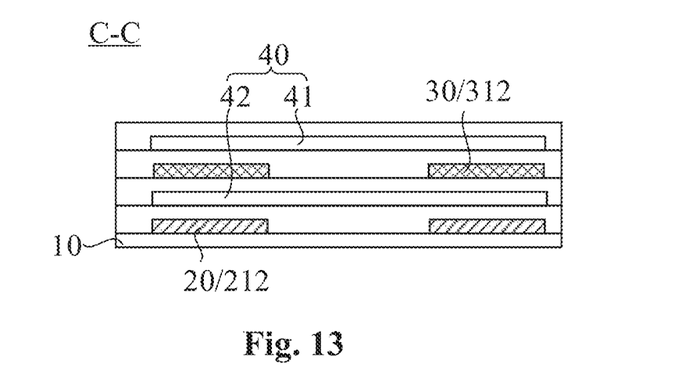
FIG. 13 shows yet another cross-sectional view of C-C in FIG. 5.

Further, in some other embodiments, please refer to FIG. 12 and FIG. 13, FIG. 12 shows a schematic structural diagram of a second shielding layer of an embodiment of the present application, and FIG. 13 shows yet another cross-sectional view of C-C in FIG. 5. The second shielding layer 42 is arranged in the wire-wrapping area DA1 and may be a ring-shaped layer structure arranged around the hole-punching area NA1. In the embodiment, the second shielding layer 42 is a ring-shaped layer structure which can effectively cover each second wire-wrapping segment 212 and simplify the manufacturing process. In the embodiment, FIG. 13 is illustrated by taking the first shielding layer 41 with a ring-shaped structure as an example, it is understood that the first shielding layer 41 may also be the structure including the plurality of first shielding wires 411 in the above embodiments.

Figure 14:
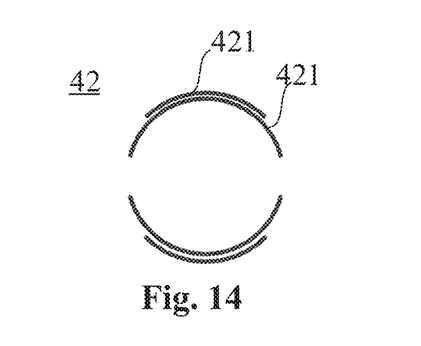
FIG. 14 shows a schematic structural diagram of a second shielding layer of another embodiment of the present application.
Figure 15:
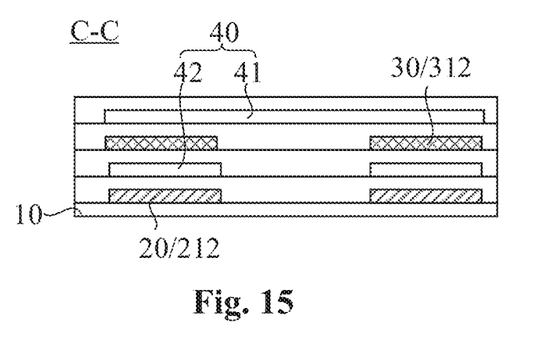
FIG. 15 shows yet another cross-sectional view of C-C in FIG. 5.

Further, in some embodiments, please refer to FIG. 14 and FIG. 15, FIG. 14 shows a schematic structural diagram of a second shielding layer of another embodiment of the present application, and FIG. 15 shows yet another cross-sectional view of C-C in FIG. 5. The second shielding layer 42 is arranged in the wire-wrapping area DA1 and includes a plurality of second shielding wires 421, and an orthographic projection of each second shielding wire 421 on the substrate 10 covers the orthographic projection of the second wire-wrapping segment 212 on the substrate 10. Further, the orthographic projection of the second shielding wire 421 on the substrate 10 coincides with the orthographic projection of the second wire-wrapping segment 212 on the substrate 10. In the embodiment, the patterned second shielding layer 42 is utilized, and the second shielding wires 421 are only arranged directly above the second wire-wrapping segment 212, cost can be saved. In the embodiment, each of the second shielding wires 421 may be directly connected to the second fixed potential terminal, alternatively, the second shielding wires 421 may be short-circuited through a second short-circuiting wire and then connected to the second fixed potential terminal through the second short-circuiting wire. In the embodiment, FIG. 15 is illustrated by taking the first shielding layer 41 with a ring-shaped structure as an example, it is understood that the first shielding layer 41 may also be the structure including the plurality of first shielding wires 411 in the above embodiments.

In some optional embodiments, the array substrate 100 further includes a power supply voltage signal wire, a reference voltage signal wire, and a low level signal wire. The first shielding layer 41 and the second shielding layer 42 are electrically connected to one of the power supply voltage signal wire, the reference voltage signal wire, and the low level signal wire. In a specific embodiment, both the first shielding layer 41 and the second shielding layer 42 are electrically connected to the power supply voltage signal wire. In the embodiment, the first shielding layer 41 and the second shielding layer 42 are electrically connected to one of the power supply voltage signal wire, the reference voltage signal wire, and the low level signal wire, the impedance of the corresponding one of the power supply voltage signal wire, the reference voltage signal wire, and the low level signal wire can also be reduced, and the signal transmission effect is improved.

In some optional embodiments, the second straight segment 211 and the second wire-wrapping segment 212 of the second signal wire 21 may be arranged in a same layer or different layers. The first straight segment 311 and the first wire-wrapping segment 312 of the first signal wire 31 may be arranged in a same layer or different layers.

In the above embodiments, in FIGS. 8, 10, 14, and 15, for example, the second wire-wrapping segment 212 and the first wire-wrapping segment 312 exactly overlap in a direction perpendicular to the array substrate 100, it is understood that the second wire-wrapping segment 212 and the first wire-wrapping segment 312 may partially overlap in the direction perpendicular to the array substrate 100.

In the following, the structural relationships among the second signal wires 21, the first signal wires 31, the first shielding layer 41, the second shielding layer 42 and various layers of the pixel circuit are described in a specific embodiment. The array substrate 100 corresponding to the wiring area AA1 in the embodiment includes a plurality of pixel circuits, and the pixel circuit may include a plurality of thin film transistors, capacitors, and other structures. The pixel circuit may specifically include a 7T1C or 2T1C circuit structure, in which "T" refers to a thin film transistor, "C" refers to a capacitor, and the number refers to the number of the thin film transistors or capacitors. Other circuit structures may also be utilized, which is not limited in the present application.

Therefore, it may be understood that the array substrate 100 of the embodiments of present application may include a plurality of pixel circuits distributed in an array.

According to the array substrate 100 of the embodiments of present application, the array substrate 100 corresponding to the wiring area AA1 includes a semiconductor layer, a first insulating layer, a first metal layer, a second insulating layer, a second metal layer, a third insulating layer, and a third metal layer which are stacked on the substrate 10 in sequence to from thin film transistors, capacitors, and other structures. A first electrode layer is further arranged on the third metal layer. In the embodiment, the second signal wires 21 may be arranged in a same layer with the first metal layer, the first signal wires 31 may be arranged in a same layer with the third metal layer, then the second shielding layer 42 may be arranged in a same layer with the second metal layer, and the first shielding layer 41 is arranged in a same layer with the first electrode layer. Therefore, in the embodiment, the first shielding layer 41 and the second shielding layer 42 are both arranged in the same layers with the existing film layers of the array substrate 100, and no additional film layer is needed, which does not increase the difficulty of the manufacturing process of the array substrate 100.

In some other optional embodiments, a fourth metal layer may be further arranged between the third metal layer and the first electrode layer, in which the power supply voltage signal wire may be arranged in the third metal layer and the fourth metal layer to reduce the impedance of the power supply voltage signal wire. Therefore, in the embodiment, at least one of the plurality of second signal wires 21 may be arranged in a same layer with the first metal layer, and at least one of the plurality of second signal wires 21 is arranged in a same layer with the second metal layer; for example, either the scan wires or the emit wires are arranged in a same layer with the first metal layer, and the others are arranged in a same layer with the second metal layer. The second shielding layer 42 may be arranged in a same layer with the third metal layer, and in the wire-wrapping area DA1, the first wire-wrapping segment 312 may be arranged in a same layer with the fourth metal layer. The first shielding layer 41 is arranged in a same layer with the first electrode layer. Similarly, in the embodiment, the first shielding layer 41 and the second shielding layer 42 are both arranged in the same layers with the existing film layers of the array substrate 100, and no additional film layer is needed, which does not increase the difficulty of the manufacturing process of the array substrate 100.

Figure 16:
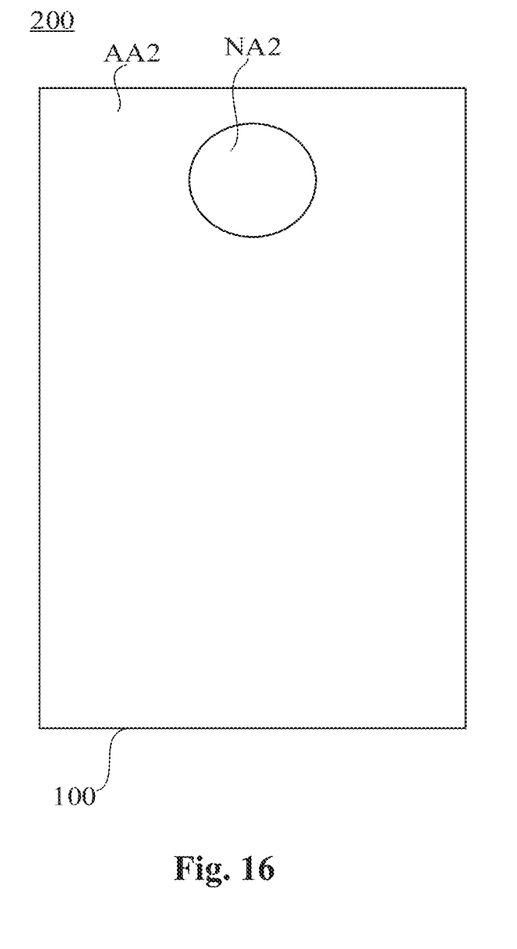
FIG. 16 shows a top schematic structural diagram of a display panel of an embodiment of the present application.

The present application further provides a display panel, and please refer to FIG. 16 which shows a top schematic structural diagram of a display panel of an embodiment of the present application. The display panel 200 includes a display area AA2 and a non-display area NA2, and the display panel 200 includes the array substrate 100 of any one of the above embodiments, in which the wiring area AA1 and the wire-wrapping area DA1 of the array substrate 100 are corresponding to the display area AA2 of the display panel 200, and the hole-punching area NA1 of the array substrate 100 is corresponding to the non-display area NA2 of the display panel 200.

Since the display panel 200 of the embodiment includes the array substrate 100 of any one of the above embodiments, the display panel 200 has the beneficial effects of the array substrate 100 of any one of the above embodiments, which will not be repeated herein.

Figure 17:
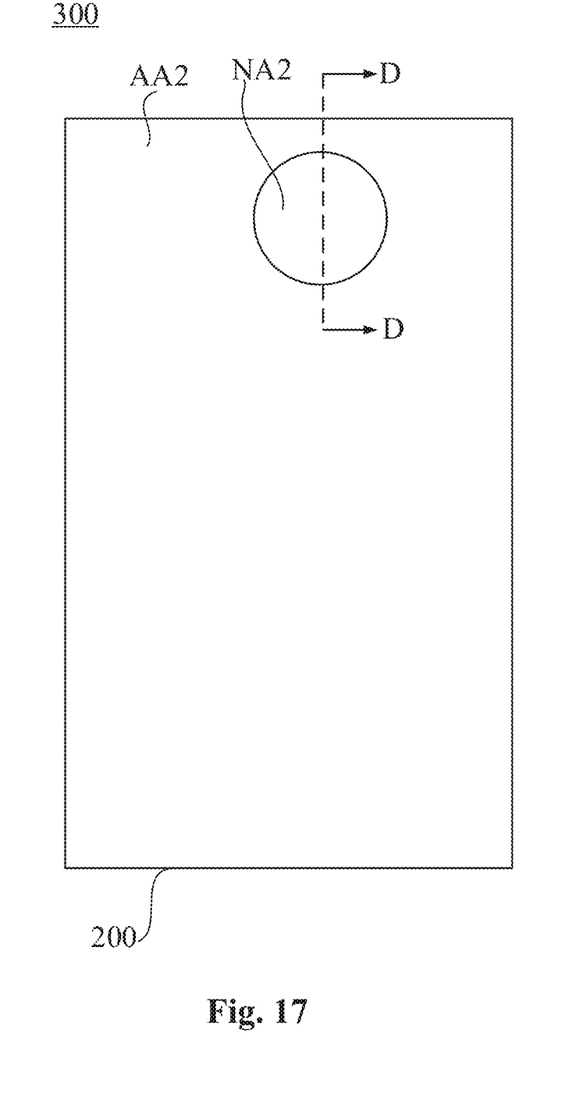
FIG. 17 shows a top schematic structural diagram of a display apparatus of an embodiment of the present application.
Figure 18:
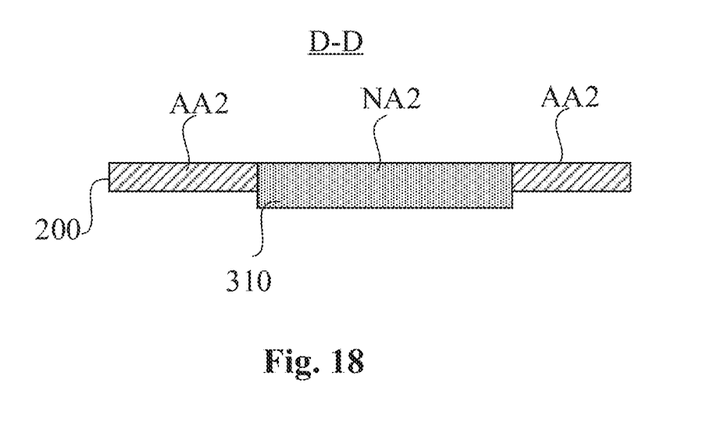
FIG. 18 shows a cross-sectional view of D-D in FIG. 17.

The embodiments of present application further provide a display apparatus 300, and please refer to FIG. 17 and FIG. 18, FIG. 17 shows a top schematic structural diagram of a display apparatus provided by an embodiment of the present application, and FIG. 18 shows a cross-sectional view of D-D in FIG. 17. The display apparatus 300 of the embodiments of present application includes the display panel 200 of any one of the above embodiments. The display apparatus 300 of the embodiment further includes a functional device 310 corresponding to the non-display area NA2 of the display panel 200.

The functional device 310 may be an image capturing device for capturing external image information. In the embodiment, the functional device 310 is a complementary metal oxide semiconductor (Complementary Metal Oxide Semiconductor, CMOS) image capturing device, and in some other embodiments, the functional device 310 may also be other image capturing devices such as a charge-coupled device (Charge-coupled Device, CCD) image capturing device. It may be appreciated that the functional device 310 may not be limited to an image capturing device. For example, in some embodiments, the functional device 310 may also be a light sensor such as an infrared sensor, a proximity sensor, an infrared lens, a flood light sensing element, an ambient light sensor and a dot projector. In addition, other devices such as a telephone receiver and a speaker may also be integrated in the non-display area NA2 of the display panel 200 of the display apparatus 300.

According to the above embodiments of the present application, these embodiments do not exhaustively describe all the details, nor do they limit the scope of the present application. Obviously, according to the above description, many modifications and changes can be made. These embodiments are selected and specifically described in the specification to better explain the principles and practical applications of the present application, so that those skilled in the art can make good use of the present application and make modifications based on the present application. The present application is only defined by the claims and their full scope and equivalents.

What is claimed is:

1. An array substrate comprising a hole-punching area, a wiring area at least partially surrounding the hole-punching area and a wire-wrapping area between the hole-punching area and the wiring area, the array substrate comprising:
   a substrate;
   a first wiring layer arranged on a side of the substrate, and the first wiring layer comprising a plurality of first signal wires, at least one of the plurality of first signal wires comprising a first straight segment in the wiring area and a first wire-wrapping segment in the wire-wrapping area, the first wire-wrapping segment being arranged around a part of the hole-punching area; and
   a shielding assembly at least comprising a first shielding layer arranged on a side of the first wiring layer, the side of the first wiring layer being away from the substrate, and the first shielding layer being insulated from the first signal wires, the first shielding layer being electrically connected to a first fixed potential terminal, and an orthographic projection of the first shielding layer on the substrate covering an orthographic projection of the first wire-wrapping segment on the substrate.

2. The array substrate of claim 1, wherein the first shielding layer is arranged in the wire-wrapping area and is a ring-shaped layer structure arranged around the hole-punching area.

3. The array substrate of claim 1, wherein the first shielding layer is arranged in the wire-wrapping area and comprises a plurality of first shielding wires, and an orthographic projection of a first shielding wire on the substrate coincides with the orthographic projection of the first wire-wrapping segment on the substrate.

4. The array substrate of claim 1, wherein the array substrate further comprises a second wiring layer arranged between the substrate and the first wiring layer, and the second wiring layer comprises a plurality of second signal wires, at least one of the plurality of second signal wires comprises a second straight segment in the wiring area and a second wire-wrapping segment in the wire-wrapping area, the second wire-wrapping segment is arranged around a part of the hole-punching area, wherein the second wire-wrapping segment at least partially overlaps the first wire-wrapping segment.

5. The array substrate of claim 4, wherein the shielding assembly further comprises a second shielding layer arranged between the first wiring layer and the second wiring layer, the second shielding layer is insulated from the first signal wires and the second signal wires, and the second shielding layer is electrically connected to a second fixed potential terminal, and an orthographic projection of the second shielding layer on the substrate covers an orthographic projection of the second wire-wrapping segment on the substrate.

6. The array substrate of claim 4, wherein the second signal wires are a plurality of scan wires and/or a plurality of light emission control signal wires, and the first signal wires are a plurality of data wires.

7. The array substrate of claim 5, wherein the second shielding layer is arranged in the wiring area and the wire-wrapping area, and the orthographic projection of the second shielding layer on the substrate further covers an orthographic projection of the second straight segment on the substrate.

8. The array substrate of claim 5, wherein the second shielding layer is arranged in the wire-wrapping area and is a ring-shaped layer structure arranged around the hole-punching area.

9. The array substrate of claim 5, wherein the second shielding layer is arranged in the wire-wrapping area and comprises a plurality of second shielding wires, and an orthographic projection of a second shielding wire on the substrate coincides with the orthographic projection of the second wire-wrapping segment on the substrate.

10. The array substrate of claim 5, wherein the array substrate further comprises a power supply voltage signal wire, a reference voltage signal wire and a low level signal wire; and
the first shielding layer and the second shielding layer are electrically connected to one of the power supply voltage signal wire, the reference voltage signal wire and the low level signal wire.

11. The array substrate of claim 4, wherein the first straight segment is arranged in a same layer or a different layer with the first wire-wrapping segment.

12. The array substrate of claim 4, wherein the second straight segment is arranged in a same layer or a different layer with the second wire-wrapping segment.

13. The array substrate of claim 4, wherein the second wire-wrapping segment at least partially overlaps the first wire-wrapping segment in a direction perpendicular to the array substrate.

14. The array substrate of claim 4, wherein the array substrate corresponding to the wiring area comprises a semiconductor layer, a first insulating layer, a first metal layer, a second insulating layer, a second metal layer, a third insulating layer, a first electrode layer and a third metal layer which are stacked on the substrate in sequence, the first signal wires are arranged in a same layer with the third metal layer, and the first shielding layer is arranged in a same layer with the first electrode layer.

15. The array substrate of claim 14, wherein the second signal wires are arranged in a same layer with the first metal layer, and the second shielding layer is arranged in a same layer with the second metal layer.

16. The array substrate of claim 14, wherein the array substrate further comprises a power supply voltage signal wire, a fourth metal layer is arranged between the third metal layer and the first electrode layer, and the power supply voltage signal wire is arranged in the third metal layer and the fourth metal layer.

17. The array substrate of claim 15, wherein at least one of the second signal wires is arranged in a same layer with the first metal layer, at least one of the second signal wires is arranged in a same layer with the second metal layer, the second shielding layer is arranged in a same layer with the third metal layer, and the first wire-wrapping segment is arranged in a same layer with the fourth metal layer.

18. The array substrate of claim 1, wherein a distance L between two adjacent first wire-wrapping segments satisfies: $L \geq 3 \, \mu m$.

19. A display panel comprising a display area and a non-display area, the display panel comprising the array substrate of claim 1, wherein the wiring area and the wire-wrapping area are corresponding to the display area, and the hole-punching area is corresponding to the non-display area.

20. A display apparatus comprising the display panel of claim 19.

* * * * *